United States Patent
Liu et al.

(10) Patent No.: US 11,170,803 B1
(45) Date of Patent: Nov. 9, 2021

(54) MAGNETIC RECORDING WRITE HEAD WITH SPIN-TORQUE OSCILLATOR (STO) AND EXTENDED SEED LAYER

(71) Applicant: Western Digital Technologies, Inc., San Jose, CA (US)

(72) Inventors: Xiaoyong Liu, San Jose, CA (US); Quang Le, San Jose, CA (US); Hongquan Jiang, San Jose, CA (US); Guangli Liu, Pleasanton, CA (US); Jui-lung Li, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/783,057

(22) Filed: Feb. 5, 2020

Related U.S. Application Data

(60) Provisional application No. 62/830,035, filed on Apr. 5, 2019.

(51) Int. Cl.
*G11B 5/235* (2006.01)
*G11B 5/31* (2006.01)
(Continued)

(52) U.S. Cl.
CPC ............ *G11B 5/235* (2013.01); *G11B 5/1278* (2013.01); *G11B 5/314* (2013.01); *G11B 5/315* (2013.01);
(Continued)

(58) Field of Classification Search
None
See application file for complete search history.

(56) References Cited

U.S. PATENT DOCUMENTS

| | | | |
|---|---|---|---|
| 7,948,044 B2 | 5/2011 | Horng et al. | |
| 7,982,996 B2 | 7/2011 | Smith et al. | |

(Continued)

FOREIGN PATENT DOCUMENTS

| | | |
|---|---|---|
| CN | 102483754 A | 5/2012 |
| JP | 2018156709 A | 10/2018 |

(Continued)

OTHER PUBLICATIONS

J G_Zhu et al., "Microwave Assisted Magnetic Recording", IEEE Transactions on Magnetics, vol. 44, No. 1, Jan. 2008, pp. 125-131.

*Primary Examiner* — Craig A. Renner
(74) *Attorney, Agent, or Firm* — Patterson & Sheridan, LLP; Steven H. Versteeg

(57) ABSTRACT

A magnetic recording write head includes a spin torque oscillator (STO) between a seed layer disposed on a write pole and trailing shield. The seed layer has a cross-track width greater than the width of the STO and a depth in a direction orthogonal to the disk-facing surface of the write pole greater than the depth of the STO. A first insulating refill layer is formed on the sides of the seed layer and STO, and a second insulating refill layer in contact with the first refill layer has a thermal conductivity greater than that of the first refill layer. When current is passing through the STO, the seed layer spreads the current to reduce heating of the write pole and STO, and the bilayer refill material facilitates the transfer of heat away from the write pole and STO.

20 Claims, 10 Drawing Sheets

(51) Int. Cl.
*G11B 5/127* (2006.01)
*G11B 5/39* (2006.01)
*G11B 5/00* (2006.01)
*G03F 7/20* (2006.01)
*G11B 5/48* (2006.01)

(52) U.S. Cl.
CPC .......... G11B 5/3133 (2013.01); G11B 5/3146 (2013.01); *G03F 7/2043* (2013.01); *G11B 5/3938* (2013.01); *G11B 5/4826* (2013.01); *G11B 2005/0024* (2013.01)

(56) References Cited

U.S. PATENT DOCUMENTS

| | | | |
|---|---|---|---|
| 8,108,985 B2 | 2/2012 | Zheng et al. | |
| 8,284,516 B1 | 10/2012 | Tang et al. | |
| 8,300,356 B2 | 10/2012 | Zhang et al. | |
| 8,305,711 B2 | 11/2012 | Li et al. | |
| 8,467,149 B2 | 6/2013 | Takeo et al. | |
| 8,472,135 B1* | 6/2013 | Kusukawa et al. | G11B 5/3146 360/110 |
| 8,488,373 B2 | 7/2013 | Zhang et al. | |
| 8,547,661 B2 | 10/2013 | Bai | |
| 8,576,519 B1 | 11/2013 | Carey et al. | |
| 8,824,104 B1 | 9/2014 | Koui et al. | |
| 8,837,086 B2 | 9/2014 | Udo et al. | |
| 8,879,205 B2 | 11/2014 | Shiimoto et al. | |
| 8,970,996 B2 | 3/2015 | Nagasaka et al. | |
| 9,001,465 B1 | 4/2015 | Shimizu et al. | |
| 9,099,113 B1 | 8/2015 | Futumoto et al. | |
| 9,142,227 B1 | 9/2015 | Etoh et al. | |
| 9,202,484 B1* | 12/2015 | Watanabe et al. | G11B 5/314 |
| 9,218,828 B1 | 12/2015 | Koui et al. | |
| 9,230,571 B1 | 1/2016 | Chen et al. | |
| 9,355,655 B1 | 5/2016 | Udo et al. | |
| 9,728,210 B2 | 8/2017 | Okamura et al. | |
| 9,805,746 B1 | 10/2017 | Okamura et al. | |
| 10,014,012 B1 | 7/2018 | Song et al. | |
| 10,186,284 B2 | 1/2019 | Narita et al. | |
| 10,236,021 B2 | 3/2019 | Narita et al. | |
| 10,276,193 B2 | 4/2019 | Narita et al. | |
| 10,325,618 B1 | 6/2019 | Wu et al. | |
| 2002/0191354 A1 | 12/2002 | Yoshikawa et al. | |
| 2006/0007603 A1 | 1/2006 | Meguro et al. | |
| 2010/0074092 A1 | 3/2010 | Zhu et al. | |
| 2012/0063034 A1 | 3/2012 | Hsu et al. | |
| 2012/0107645 A1 | 5/2012 | Zheng et al. | |
| 2012/0262820 A1 | 10/2012 | Matsumoto et al. | |
| 2012/0262821 A1 | 10/2012 | Taguchi et al. | |
| 2013/0062308 A1 | 3/2013 | Funayama et al. | |
| 2013/0063837 A1* | 3/2013 | Udo et al. | G11B 5/3146 360/125.29 |
| 2014/0104724 A1 | 4/2014 | Shiroishi et al. | |
| 2014/0146420 A1 | 5/2014 | Shimizu et al. | |
| 2014/0177100 A1* | 6/2014 | Sugiyama et al. | G11B 5/1278 360/125.03 |
| 2014/0211340 A1* | 7/2014 | Sugiura et al. | G11B 5/3133 360/319 |
| 2014/0313616 A1* | 10/2014 | Kusukawa et al. | G11B 5/3146 360/125.03 |
| 2015/0098105 A1 | 4/2015 | Yamaki | |
| 2015/0098150 A1 | 4/2015 | Chiu et al. | |
| 2015/0109699 A1* | 4/2015 | Boone et al. | G11B 5/3146 360/125.32 |
| 2016/0118065 A1 | 4/2016 | Chen et al. | |
| 2017/0301855 A1 | 10/2017 | Zhang et al. | |
| 2018/0268848 A1 | 9/2018 | Narita et al. | |
| 2019/0088274 A1 | 3/2019 | Narita et al. | |
| 2019/0088275 A1 | 3/2019 | Narita et al. | |
| 2019/0251992 A1* | 8/2019 | Ho et al. | G11B 5/3146 |
| 2019/0259413 A1* | 8/2019 | Le et al. | G11B 5/3146 |
| 2019/0279662 A1* | 9/2019 | Liu et al. | G11B 5/3146 |
| 2020/0372929 A1* | 11/2020 | Le et al. | G11B 5/1278 |

FOREIGN PATENT DOCUMENTS

JP 2019057338 A 4/2019
WO 2016099516 A1 6/2016

\* cited by examiner

MAGNETIC RECORDING WRITE HEAD WITH SPIN-TORQUE OSCILLATOR (STO) AND EXTENDED SEED LAYER

CROSS-REFERENCE TO RELATED APPLICATIONS

This application claims benefit of U.S. Provisional Patent Application Ser. No. 62/830,035, filed Apr. 5, 2019, which is herein incorporated by reference.

BACKGROUND OF THE DISCLOSURE

Field of the Disclosure

Embodiments of the present disclosure generally relate to magnetic recording systems, and more particularly to a magnetic recording system with a spin-torque oscillator (STO) incorporated into the write head.

Description of the Related Art

Perpendicular magnetic recording (PMR) in magnetic recording hard disk drives, wherein the recorded bits are stored in a perpendicular or out-of-plane orientation in the magnetic recording layer of the disk, allows for ultra-high recording density, i.e., the areal density of the recorded bits on the disk. However, an increase in recording density requires a corresponding reduction in the size of the magnetic grains in the magnetic recording layer to achieve sufficient medium signal-to-noise ratio. As the size of the magnetic grains is reduced, the magnetocrystalline anisotropy of the magnetic grains must be increased to maintain adequate thermal stability. Simultaneously, the magnetic write field from the write head has to exceed the coercivity of the magnetic recording layer to achieve saturation digital recording, resulting in a conflicted limitation on the anisotropy of the magnetic grains.

PMR systems have been proposed that use a spin-torque oscillator (STO) incorporated into the disk drive's conventional write head. DC current, with a current density J above a critical value JC, is applied to the STO across the write pole and the trailing shield of the write head to cause a ferromagnetic layer in the STO to generate a high frequency oscillatory auxiliary magnetic field.

In one type of PMR write head with an incorporated STO a ferromagnetic free layer or field generation layer (FGL) in the STO generates an oscillatory auxiliary magnetic field to the magnetic grains of the recording layer. The auxiliary field may have a frequency close to the resonance frequency of the magnetic grains in the recording layer to facilitate the switching of the magnetization of the grains at lower write fields from the conventional write head than would otherwise be possible without assisted recording. Conversely, MAMR may be used to increase the coercivity of the magnetic recording layer above that which could be written to by a conventional PMR write head alone. The increase in coercivity allows for a reduction in the size of the magnetic grains and thus a corresponding increase in recording density. This type of system is sometimes referred to as microwave-assisted magnetic recording (MAMR). MAMR systems are described by J. G. Zhu et al., "Microwave Assisted Magnetic Recording", IEEE Transactions on Magnetics, Vol. 44, No. 1, January 2008, pp. 125-131; and in U.S. Pat. No. 7,982,996 B2 and U.S. Pat. No. 8,970,996 B2, both assigned to the same assignee as this application.

In one proposed MAMR system, the STO is located between the write pole and the trailing magnetic shield of the write head. The STO electrical circuitry is connected to either separate electrodes, or to the write pole and trailing shield which function as the electrodes. The STO is a multilayer film stack made up of two or more ferromagnetic layers separated by a nonmagnetic electrically-conducting spacer layer. One of the ferromagnetic layers, called the field generation layer (FGL) or free layer, is designed to have its magnetization orientation oscillate or precess in the presence of STO current perpendicular to the film planes. Another ferromagnetic layer, the polarizer or spin-polarizing layer (SPL), is designed to supply spin-polarized electrons to the free layer in the presence of the STO current. The STO electrical circuitry supplies DC current to the STO. The electrons become spin polarized by the polarizer, which creates the spin transfer torque on the magnetization of the free layer. This destabilizes the static equilibrium of the free layer's magnetization orientation, causing it to undergo sustained oscillation. If the oscillation frequency is near the resonance frequency of the magnetic grains in the recording layer, the switching of the magnetization of the grains will occur at a lower write field from the conventional write head.

In a PMR system with a STO incorporated into the disk drive's conventional write head, even if the oscillatory auxiliary magnetic field does not provide microwave assistance to writing, a DC field component in the gap between the trailing shield and the write pole due to switching of the magnetization will assist writing by the conventional write head.

SUMMARY OF THE DISCLOSURE

A magnetic recording write head includes a spin torque oscillator (STO) between a seed layer disposed on a write pole and trailing shield. The seed layer has a cross-track width greater than the width of the STO and a depth in a direction orthogonal to the disk-facing surface of the write pole greater than the depth of the STO. A first insulating refill layer is formed on the sides of the seed layer and STO, and a second insulating refill layer in contact with the first refill layer has a thermal conductivity greater than that of the first refill layer. When current is passing through the STO, the seed layer spreads the current to reduce heating of the write pole and STO, and the bilayer refill material facilitates the transfer of heat away from the write pole and STO.

In one embodiment, a write head comprises a substrate, a write pole recessed into the substrate, and an insulating material surrounding at least two sides of the write pole. The insulating material is recessed into the substrate. A surface of the write pole, a surface of the substrate, and a surface of the insulating material align to form a substantially planar surface. The write head further comprises a seed layer disposed on the write pole and a portion of the insulating material on the substantially planar surface, the seed layer having a first cross-track width parallel to the substantially planar surface of the substrate, a spin torque oscillator disposed on the seed layer, the spin torque oscillator having a second cross-track width less than the first cross-track width of the seed layer, and one or more insulating refill layers disposed on the substantially planar surface adjacent to the seed layer, the spin torque oscillator, and the capping layer.

In another embodiment, a microwave-assisted magnetic recording assembly comprises at least one load beam assembly, a flexure coupled to the at least one load beam assembly, a slider coupled to the flexure, the slider having a trailing surface, and a write head coupled to the trailing surface of the slider. The write head comprises a write pole having a first cross-track width, an insulating material surrounding at least two sides of the write pole, and a substrate surrounding at least two sides of the insulating material. The write pole and the insulating material are recessed into the substrate. A surface of the write pole, a surface of the substrate, and a surface of the insulating material align to form a substantially planar surface. The write head further comprises a seed layer disposed on the write pole and a portion of the insulating material on the substantially planar surface, the seed layer having a second cross-track width less than the first cross-track width, a spin torque oscillator disposed on the seed layer, the spin torque oscillator having a third cross-track width less than both the first cross-track width of the write pole and the second cross-track width of the seed layer, and one or more insulating refill layers disposed on the substantially planar surface adjacent to the seed layer, the spin torque oscillator, and the capping layer.

In another embodiment, a method of forming a write head comprises depositing a seed layer on a substrate, the substrate comprising a write pole. The seed layer is deposited to cover the write pole. The method further comprises depositing one or more spin torque oscillator (STO) layers on the seed layer to form an STO, depositing a capping layer on the STO, lithographically patterning a first photoresist on the capping layer having a width that defines a width of seed layer in the cross-track direction, etching portions of the seed layer, the STO, and the capping layer using vertical Argon-based ion beam etching, depositing alumina into the etched portions, removing the first photoresist, depositing a diamond-like carbon hard mask layer over the alumina and capping layer, depositing a polyimide coating on the diamond-like carbon hard mask layer, depositing a silicon hard mask on the polyimide coating, lithographically patterning a second photoresist on the silicon hard mask, etching the diamond-like carbon hard mask layer, the polyimide coating, the silicon hard mask, and the alumina one or more times, removing the second photoresist layer, and depositing one or more insulating refill layers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A magnetic recording write head includes a spin torque oscillator (STO) between a seed layer disposed on a write pole and trailing shield. The seed layer has a cross-track width greater than the width of the STO and a depth in a direction orthogonal to the disk-facing surface of the write pole greater than the depth of the STO. A first insulating refill layer is formed on the sides of the seed layer and STO, and a second insulating refill layer in contact with the first refill layer has a thermal conductivity greater than that of the first refill layer. When current is passing through the STO, the seed layer spreads the current to reduce heating of the write pole and STO, and the bilayer refill material facilitates the transfer of heat away from the write pole and STO.

Figure 1:
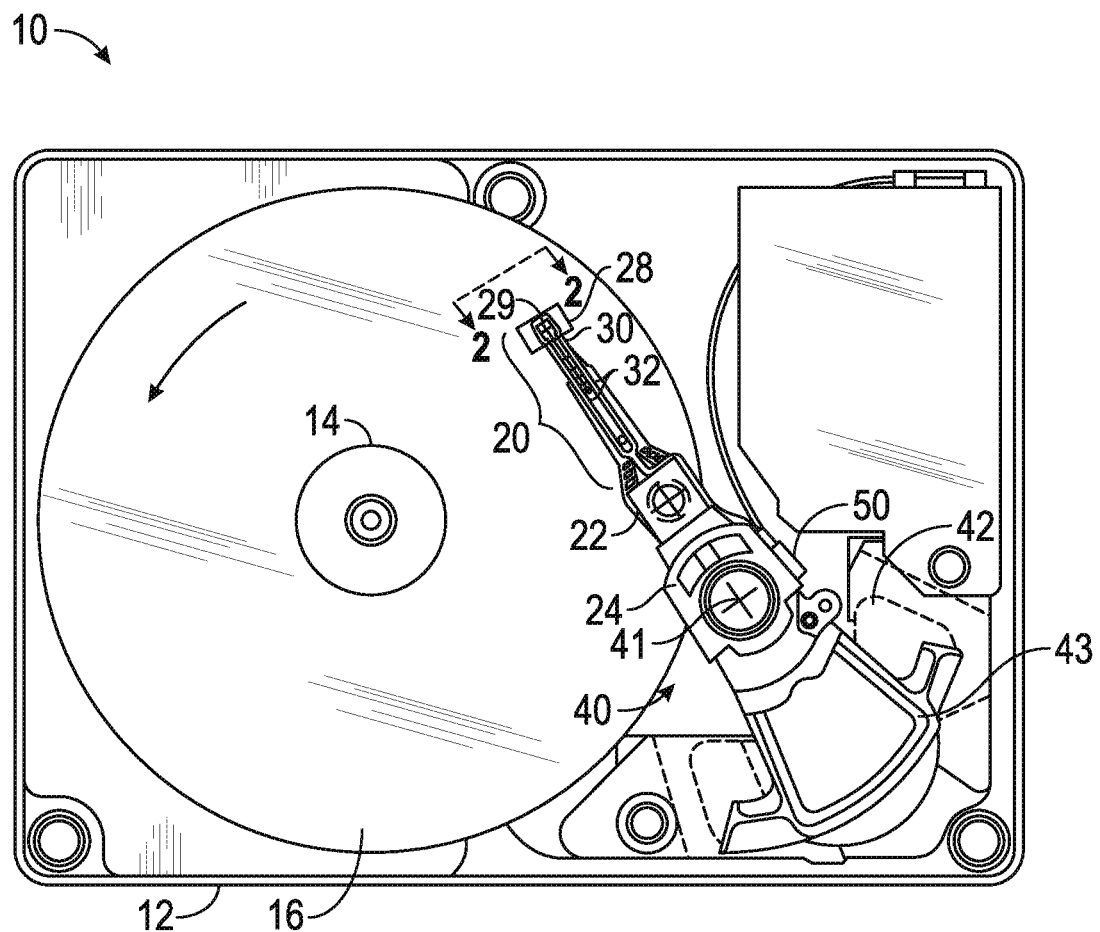
FIG. 1 is a top plan view of a conventional head/disk assembly of a hard disk drive with the cover removed that may function as a microwave-assisted magnetic recording (MAMR) disk drive.

FIG. 1 is a top plan view of a conventional head/disk assembly of a hard disk drive with the cover removed that may function as a microwave-assisted magnetic recording (MAMR) disk drive. The disk drive 10 includes a rigid base 12 supporting a spindle 14 that supports a stack of disks, including top disk 16. The spindle 14 is rotated by a spindle motor (not shown) for rotating the disks in the direction shown by curved arrow on disk 16. The hard disk drive 10 has at least one load beam assembly 20 having an integrated lead suspension (ILS) or flexure 30 with an array 32 of electrically conductive interconnect traces or lines. The load beam assemblies 20 are attached to rigid arms 22 connected to an E-shaped support structure, sometimes called an E-block 24. Each flexure 30 is attached to a gas-bearing slider 28. A magnetic recording read/write head 29 is located at the end or trailing surface of slider 28. In embodiments of this disclosure, the write head 29 will incorporate a spin-torque oscillator (STO) (not shown).

The flexure 30 enables the slider 28 to "pitch" and "roll" on a gas-bearing (typically air or helium) generated by the rotating disk 16. Disk drive 10 also includes a rotary actuator assembly 40 rotationally mounted to the rigid base 12 at a pivot point 41. The actuator assembly 40 is a voice coil motor (VCM) actuator that includes a magnet assembly 42 fixed to base 12 and a voice coil 43. When energized by control circuitry (not shown) the voice coil 43 moves and thereby rotates E-block 24 with attached arms 22 and load beam assemblies 20 to position the read/write heads 29 to the data tracks on the disks. The trace interconnect array 32 connects at one end to the read/write head 29 and at its other end to read/write circuitry contained in an electrical module or chip 50 secured to a side of the E-block 24. The chip 50 includes a read preamplifier and a write driver circuit.

Figure 2A:
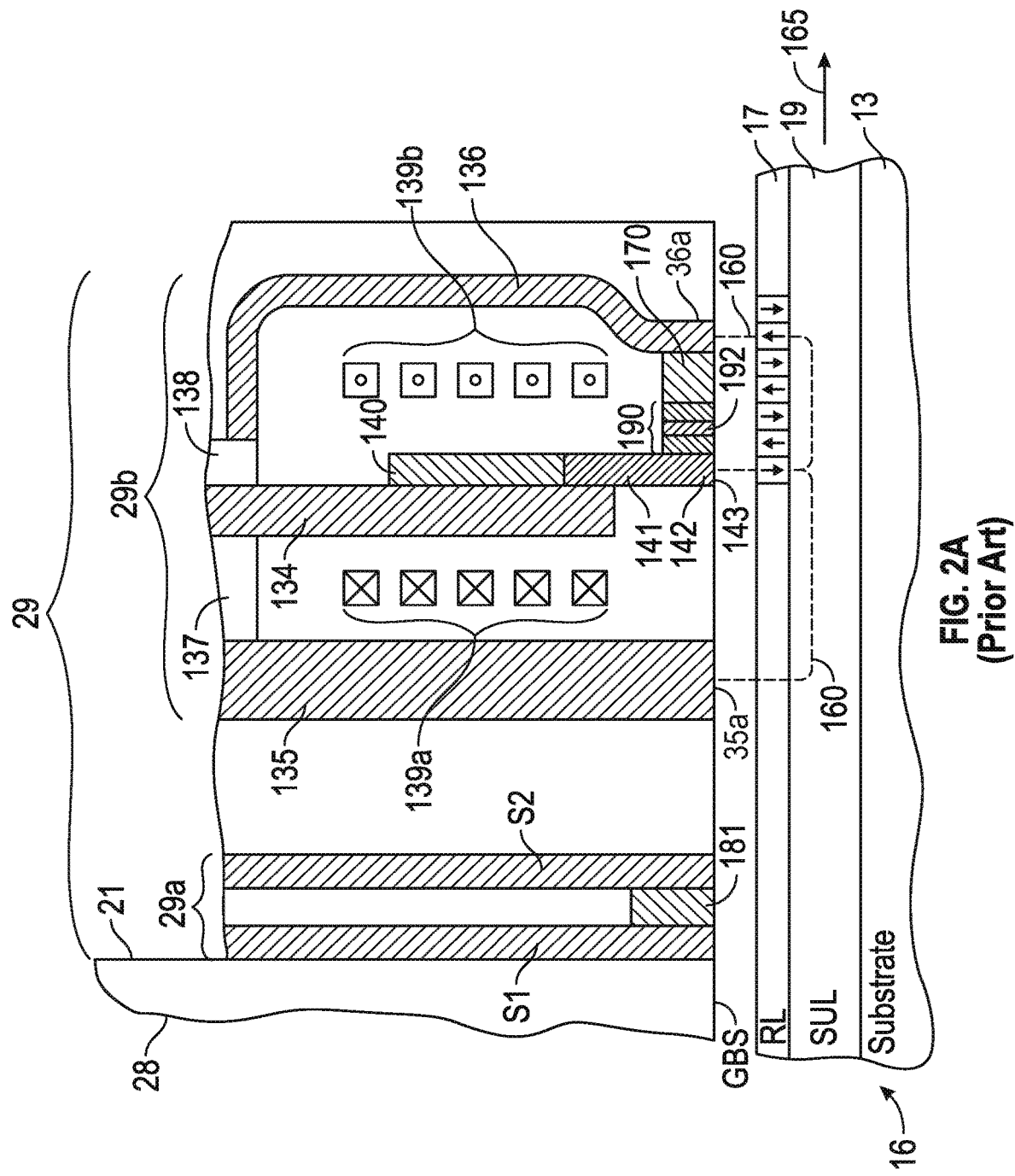
FIG. 2A is a side sectional view of a perpendicular write head with an incorporated spin-torque oscillator (STO) as proposed in the prior art, a read head and a recording disk taken through a central plane that intersects a data track on the disk.

FIG. 2A is a side sectional view of a perpendicular magnetic recording write head with an incorporated STO as proposed in the prior art, a read head and a recording disk taken through a central plane that intersects a data track on the disk. As shown in FIG. 2A, a "dual-layer" disk 16 includes a perpendicular magnetic data recording layer (RL) 17 on a "soft" or relatively low-coercivity magnetically permeable underlayer (SUL) 19 formed on the disk substrate 13. The read/write head 29 is formed on slider 28 and includes read head 29a and write head 29b. Read head 29a includes a magnetoresistive (MR) read element or sensor 181 located between two magnetic shields S1, S2. The write head 29b is a single write pole type of perpendicular magnetic recording (PMR) write head and includes a yoke structure with main pole 134, write pole 140, first flux return pole 135, second flux return pole 136, trailing magnetic shield 170, STO 190 between write pole 140 and trailing shield 170, and yoke studs 137, 138 connecting the main pole and return poles 135, 136 respectively.

The write head 29b also includes a thin film coil 139a, 139b shown in section around main pole 134. The write coil 139a, 139b is a helical coil wrapped around main pole 134, but the write coil may also be a conventional dual "pancake" coil in which all the coil sections are in substantially the same plane and wrapped around the yoke. A flared write pole (WP) 140 is part of the main pole 134 and has a flared portion 141 and a pole tip 142 with an end 143 that faces the outer surface of disk 16. Write current through coil 139a, 139b induces a magnetic field (shown by dashed line 160) from the WP 140 that passes through the RL 17 (to magnetize the region of the RL 17 beneath the WP 140), through the flux return path provided by the SUL 19, and back to the ends 35a, 36a of return poles 135, 136, respectively.

The read/write head 29 is typically formed as a series of thin films deposited on a trailing surface 21 of gas-bearing slider 28 that has its gas-bearing surface (GBS) supported above the surface of disk 16. The MR read head 29a is comprised of MR sensor 181 located between MR shields S1 and S2 and is deposited on the trailing end 21 of the slider 28 prior to the deposition of the layers making up the write head 29b. In FIG. 2A, the disk 16 moves past the write head 29b in the direction indicated by arrow 165, so the portion of slider 28 that supports the read head 29a and write head 29b is often called the slider "trailing" end, and the surface 21 perpendicular to the slider GBS on which the write head 29b is located is often called the slider "trailing" surface.

The RL 17 is illustrated with perpendicularly recorded or magnetized regions, with adjacent regions having opposite magnetization directions, as represented by the arrows. The magnetic transitions between adjacent oppositely-directed magnetized regions are detectable by the MR sensor 181 as the recorded bits.

FIG. 2A also illustrates a trailing shield (TS) 170 spaced from WP 140. The TS 170 is formed of ferromagnetic material. The STO 190 is located between WP 140 and TS 170. The STO 190 includes a ferromagnetic layer 192 whose magnetization precesses in the presence of DC current from electrical circuitry (not shown) connected to the WP 140 and the TS 170. A seed layer (not shown) is typically located between the WP 140 and the STO 190 and a capping layer (not shown) may be located between STO 190 and TS 170.

Figure 2B:
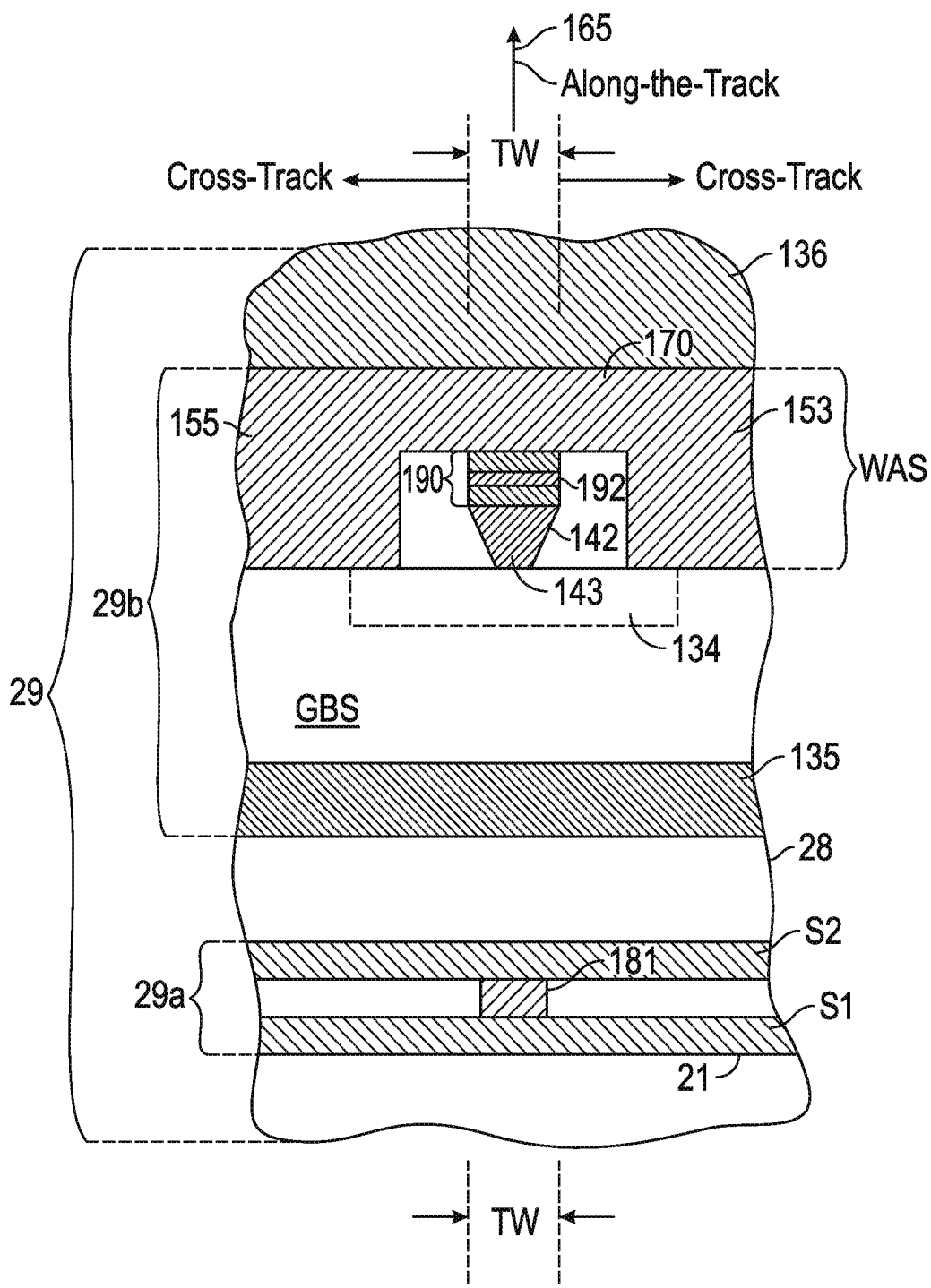
FIG. 2B is a view of the read/write head of FIG. 2A as seen from the disk.

FIG. 2B illustrates the read/write head 29 as seen from the disk 16. The GBS is the recording-layer-facing surface of the slider 28 that faces the disk 16 (FIG. 2A) and is shown without the thin protective overcoat typically present in an actual slider. The recording-layer-facing surface shall mean the surface of the slider 28 that is covered with a thin protective overcoat, the actual outer surface of the slider if there is no overcoat, or the outer surface of the overcoat. The phrase "substantially at the recording-layer-facing surface" shall mean actually at the surface or slightly recessed from the surface. The disk 16 (FIG. 2A) moves relative to the read/write head 29 in the direction 165, which is called the along-the-track direction. The direction perpendicular to direction 165 and parallel to the plane of the GBS is called the cross-track direction. The width of the end 143 of WP tip 142 in the cross-track direction substantially defines the track-width (TW) of the data tracks in the RL 17 (FIG. 2A). The main pole 134 is shown with dashed lines because it is recessed from the GBS (see FIG. 2A).

The portions identified as 153, 155 on opposite ends of TS 170 are side shields that together with TS 170 form a wraparound shield (WAS) that generally surrounds the WP tip 142. The shields 170, 153, 155 all have ends substantially at the recording-layer-facing surface. The shields 170, 153, 155 are formed as a single-piece structure to form the WAS that substantially surrounds the WP tip 142 and are thus formed of the same material, typically a NiFe, CoFe or NiFeCo alloy, so that they have the same alloy composition. The side shields 153, 155 are separated from WP tip 142 by nonmagnetic gap material. The STO 190 is located between the WP tip 142 and the TS 170. The WAS alters the angle of the write field and improves the write field gradient at the point of writing, and also shields the writing field at regions of the RL away from the track being written. The WAS is shown as connected to the return pole 136. However, the WAS may be a "floating" WAS shield not connected to either the return pole 136 or other portions of the yoke by flux-conducting material. Also, instead of a WAS, the write head 29b may have separate side shields not connected to the TS 170.

Figure 3:
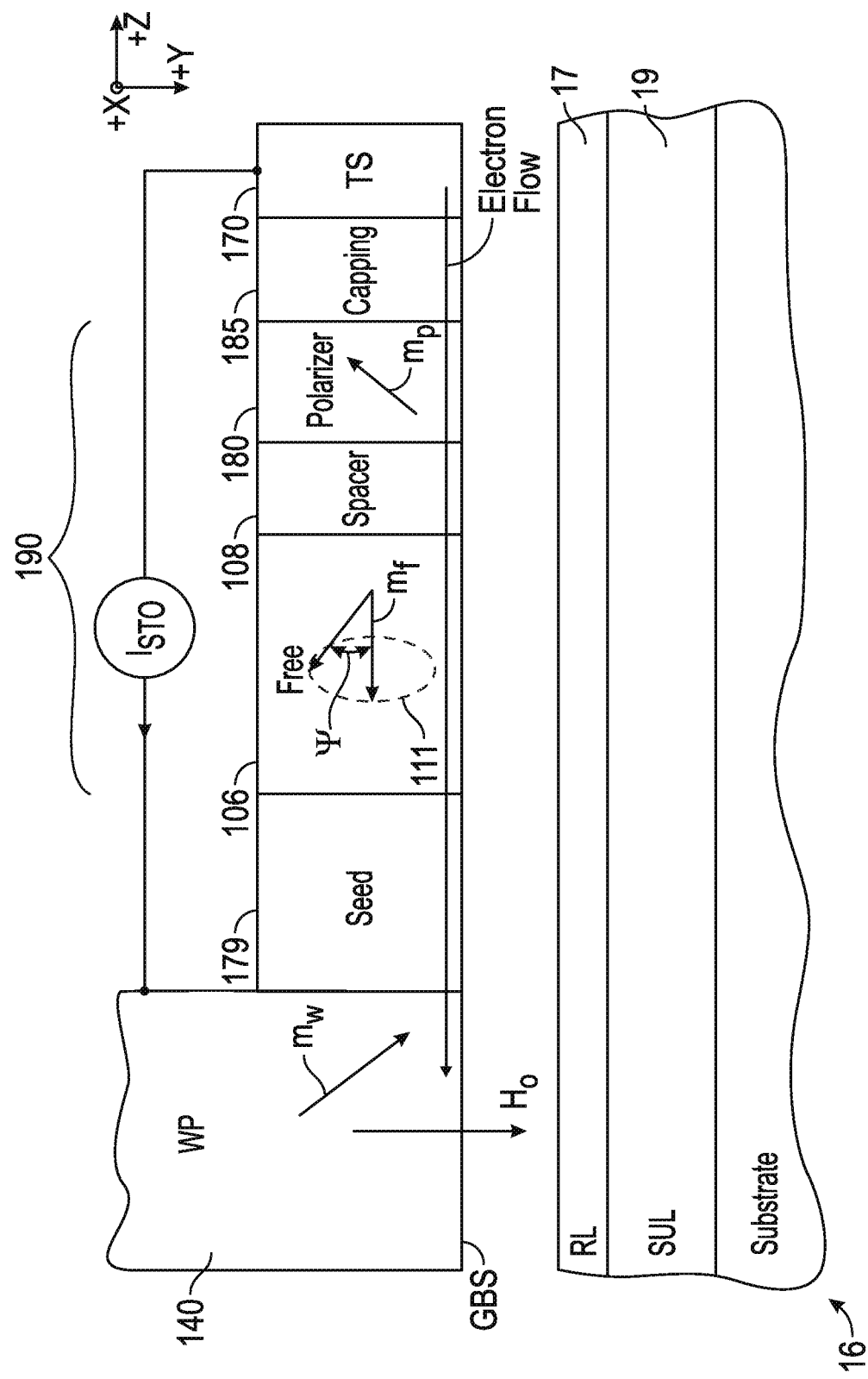
FIG. 3 is a side sectional view of a microwave-assisted magnetic recording (MAMR) write head with a spin-torque oscillator (STO) and a section of a perpendicular recording disk for illustrating the general operation of a MAMR write head as proposed in the prior art.

The general operation of a write head with a spin-torque oscillator (STO) for MAMR will be explained with the side sectional view of FIG. 3. The WP 140 functions as a first electrode and is formed of a ferromagnetic material and has a magnetization mw. The TS 170 functions as the second electrode and may be formed of a ferromagnetic material. The STO 190 includes field generation layer (FGL) or free layer 106, spin polarizer or polarizing layer 180 and non-magnetic spacer layer 108 between free layer 106 and polarizing layer 180. The polarizing layer 180 has a magnetization mp. The nonmagnetic spacer layer 108 is typically formed of Cu, but may also be formed of other materials like Au or Ag. A nonmagnetic electrically-conducting seed layer 179 for promoting the proper crystalline growth of free layer 106 is located between WP 140 and free layer 106. The seed layer 179 may be one or more films selected from one or more of Cu, Cr, Ta, Ru, Hf, Nb, W and NiAl, but is preferably a multilayer like a Cr/Ta/Ru or Cu/Ta/Ru multilayer. A nonmagnetic capping layer 185 is located between polarizing layer 180 and the TS 170. The polarizing layer 180 may be formed of a magnetic material like CoFe, and the capping layer 185 may be formed of a layer or multilayer of metals or metal alloys like Ru, Ir, Ta and Ti.

The STO 190 electrical circuitry is connected between both electrodes and during writing provides DC current ISTO between the WP 140 and the TS 170. The electron flow, by convention, is in the opposite direction from the WP 140 to the TS 170. The polarizing layer 180 supplies spin-polarized electrons for the STO 190. The STO's ferromagnetic free layer 106 has an edge substantially at the GBS and has its magnetization (mf) free to rotate.

In operation of the STO 190, DC current ($I_{STO}$), with a current density J above a critical value $J_C$, is applied across the WP 140 and the TS 170. The flow of electrons is from the TS 170 to polarizing layer 180, where spin-polarized electrons are generated, to free layer 106, seed layer 179 and WP 140. The spin-polarized electrons apply a spin torque on the magnetization $m_f$ of the free layer 106. This induces an oscillation or precessional motion of the magnetization $m_f$ of the free layer 106. The free layer magnetization $m_f$ makes an angle ψ with the X-Y plane and has a component in the X-Y plane that rotates at an azimuthal angle about the Z-axis with a certain frequency f. The rotation of the free layer magnetization about the Z-axis at this approximately fixed angle w is depicted by the oval 111 which represents a circular precessional motion of the tip of the magnetization vector $m_f$ lying in a plane parallel to the X-Y plane. The frequency of precession depends on the properties and thicknesses of the materials making up the STO 190, but for a specific STO the frequency of precession is a function of the values of both $I_{STO}$ and the write field $H_0$.

During writing, the WP 140 applies a write field $H_0$ to the magnetic grains in the recording layer (RL) at the same time the precession of the free layer magnetization $m_f$ from the STO 190 applies an auxiliary ac field at frequency f to the magnetic grains. This results in microwave-assisted magnetic recording (MAMR), which improves the switching of the magnetization of the grains in the RL, with the improvement depending on the frequency f at which the auxiliary field is applied. As is well known in the art, ferromagnetic materials absorb energy from AC magnetic fields more efficiently at or near their ferromagnetic resonance frequency, as described in Kittel C., "On the Theory of Ferromagnetic Resonance Absorption", *Phys. Rev.* 73, pp. 155-161 (1948).

Accordingly, the frequency f of the auxiliary magnetic field from the free layer 106 of the STO 190 is designed to be preferably within a range near the ferromagnetic resonance of the magnetic material making up the grains in the RL, e.g., about 30-50 GHz. As a result, the write field required from the conventional PMR write head can be reduced from what would be required to switch the magnetization of the grains in the RL without MAMR. Conversely, MAMR may be used to increase the coercivity of the RL above that which could be written to by a conventional PMR write head alone. When write current from the coil is switched, the write field $H_0$ is switched from the direction into the RL (as depicted in FIG. 3) to out of the RL, which results in a switching of directions of the magnetization $m_w$, $m_p$ and $m_f$.

A film of Ru alloy is the preferred film of multilayered seed layer 179 to be located immediately adjacent to free layer 106. For free layers with ordered phases such as Heusler alloys, an additional NiAl alloy film can be inserted adjacent the free layer. The ferromagnetic free layer 106 may be formed of conventional ferromagnetic materials such as NiFe and CoFe alloys, but may also be formed of or comprise a ferromagnetic Heusler alloy, some of which are known to exhibit high spin-polarization in their bulk form. Full and half Heusler alloys are intermetallics with particular composition and crystal structure. Examples of Heusler alloys include but are not limited to the full Heusler alloys $Co_2MnX$ (where X is one or more of Al, Sb, Si, Sn, Ga, or Ge) and $Co_2FeZ$ (where Z is one or more of Ge, Si, Al, Sn or Ga). Examples also include but are not limited to the half Heusler alloys NiMnSb, and PtMnSb. A perfect Heusler alloy will have 100% spin-polarization.

However it is possible that in a thin-film form and at finite temperatures, the band structure of the Heusler alloy may deviate from its ideal half metal structure and that the spin polarization will decrease. For example, some alloys may exhibit chemical site disorder and crystallize in the B2 structure instead of the L21 Heusler structure. Nevertheless, the spin polarization may exceed that of conventional ferromagnetic alloys. Thus, as used herein a "Heusler alloy" shall mean an alloy with a composition substantially the same as that of a known Heusler alloy, and which results in enhanced spin polarization compared to conventional ferromagnetic materials such as NiFe and CoFe alloys.

A problem associated with a write head with an incorporated STO is that the high current density required to generate precession or oscillation in the STO introduces strong heating of the WP material and the materials making up the STO. This can increase oxidation of these materials, which leads to corrosion and thus poor reliability of the write head.

Figure 4A:
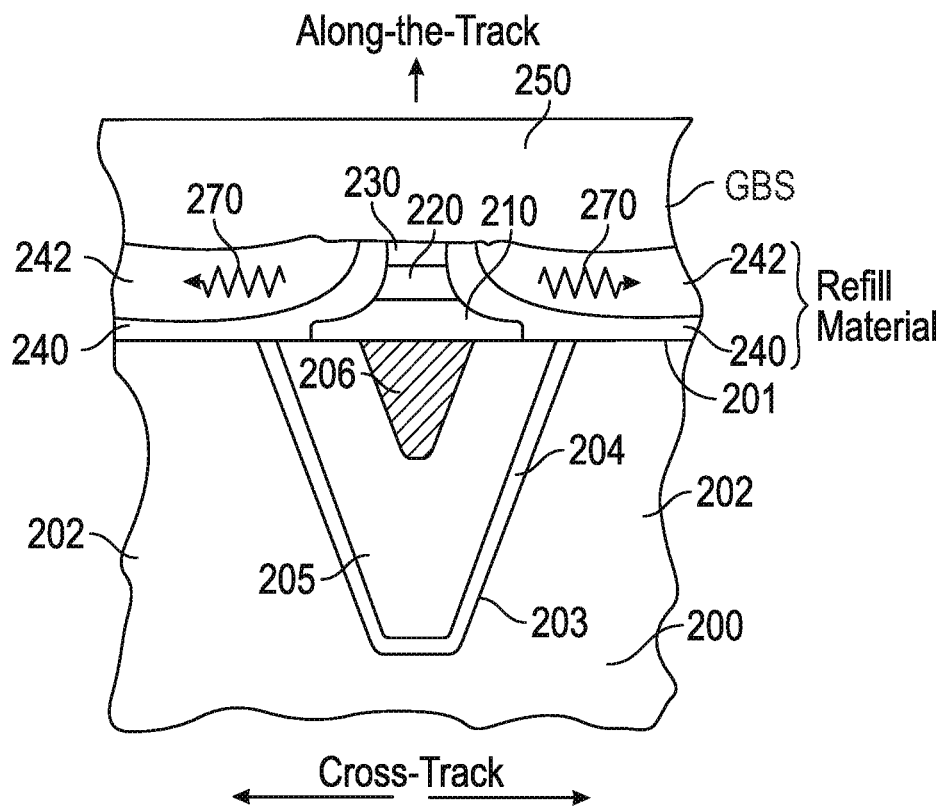
FIG. 4A is a view of the gas-bearing surface (GBS) of a write head, according to an embodiment of the disclosure.
Figure 4B:
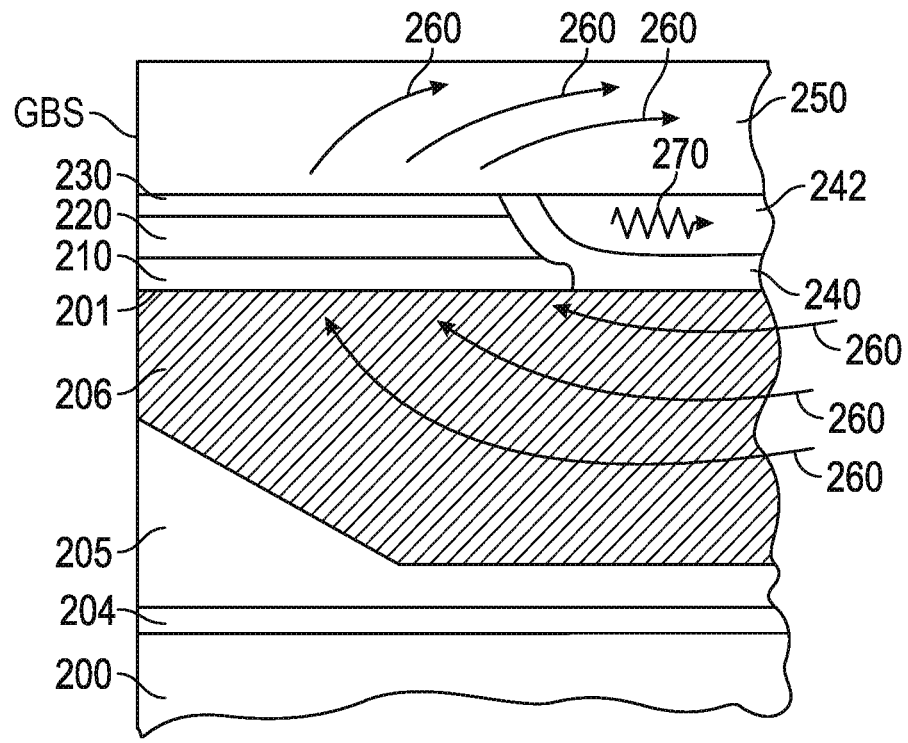
FIG. 4B is a sectional view of a plane orthogonal to the GBS showing the back end of the write head, according to an embodiment of the disclosure.
Figure 4C:
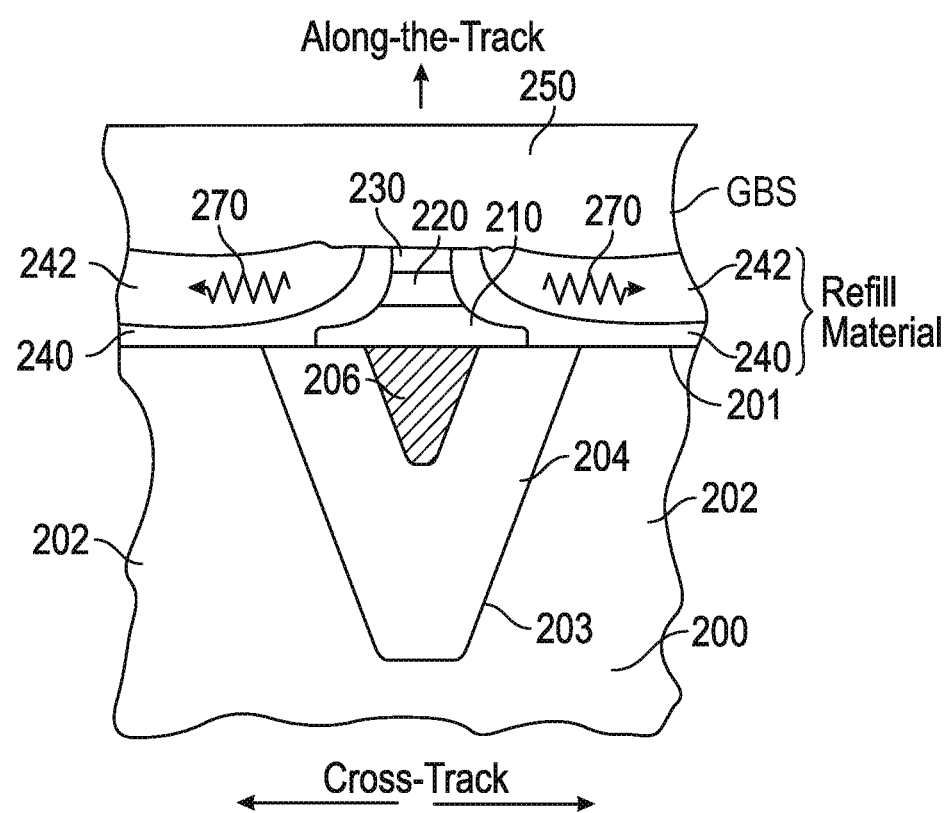
FIG. 4C is a view of the gas-bearing surface (GBS) of a write head, according to another embodiment of the disclosure.

FIG. 4A is a view of the GBS of a write head according to an embodiment of the disclosure. FIG. 4B is a sectional view of a plane orthogonal to the GBS showing the back end of the write head, and FIG. 4C is a view of the GBS of a write head according to another embodiment of the disclosure. A substrate 200 has a substantially planar surface 201. The substrate 200 material may be soft magnetic side shield material 202 into which a recess 203 has been formed. The side shield material is typically a NiFe, CoFe or NiFeCo alloy. The recess 203 is filled with insulating material 204, typically an aluminum oxide (AlOx), then a layer of metal or metal alloy 205, which may be for example Ru, Cr, or Ta or their alloys, then the material for WP 206, which is typically CoFe or other high-moment magnetic alloy. In some embodiments, the metal or metal alloy 205 is omitted and only insulating material 204 is located between the WP 206 and the side shield material 202, as shown in FIG. 4C. The formation of the recess 203 and the filling of it with insulating material 203, metal or metal alloy 204 and WP 206 is by the well-known Damascene process for forming a WP for a conventional disk drive write head. The substantially planar substrate surface 201 is thus made up of WP 206, regions of metal or metal alloy 205 on the sides of WP 206, regions of insulating material 204 on the sides of metal or metal alloy 205, and side shield material 202 on the sides of the insulating material 204.

In embodiments of this disclosure an extended seed layer 210 is formed on substrate surface 201, specifically on WP 206. The seed layer 210 has a cross-track width greater than the cross-track width of the WP 206, which is typically in the range of about 50-100 nm, but less than the cross-track width defined by the spacing of the two sides of insulating material 204, so that it is not in contact with side shield material 202 and is preferably only in contact with the WP 206 and the metal or metal alloy 205. The STO 220 is formed on seed layer 210 and preferably has a cross-track width less than the cross-track width of WP 206. The STO 220 may be a conventional STO like that described for STO 190 in FIG. 3. The free layer of the STO may be formed on the seed layer 210, as shown in FIG. 3, or the free layer and polarizing layer may be reversed, with the polarizing layer formed on the seed layer 210. An optional capping layer 230 may be formed on STO 220. Insulating refill material is formed on the substrate surface 201 and on both sides of seed layer 210, STO 220 and capping layer 230. In this embodiment the refill material is preferably a multilayer, for example first layer 240 and second layer 242. A trailing shield 250 of ferromagnetic material like a NiFe, CoFe or NiFeCo alloy is formed over capping layer 230 and the refill material 240, 242, or directly on STO 220 and refill material 240, 242 if there is no capping layer.

As shown in FIG. 4A, the seed layer 210 is wider than the STO 220 in the cross-track direction, and as shown in FIG. 4B may also have a depth in a direction orthogonal to the GBS that is greater than the depth of STO 220. For example, if the WP 206 has a width of about 60 nm, the seed layer 210 may have a width of about 100 nm and the STO 220 may have a width of about 50 nm. If the STO 220 has a depth of about 50 nm, then the seed layer 210 may have a depth of about 100 nm. The seed layer 210 is thus an extended seed layer in that it extends beyond the dimensions of the STO 220. In this manner the extended seed layer spreads the current that passes between the WP 206 and the trailing shield 250 and thus acts to reduce heating of the WP 206 and STO 220. This is depicted by arrows 260 in FIG. 4B showing current flowing into extended seed layer 210, through STO 220 and into trailing shield 250.

The seed layer 210 may be one or more films selected from one or more of Cu, Cr, Ta, Ru, Hf, Nb, W and NiAl, but is preferably a multilayer like a Cr/Ta/Ru or Cu/Ta/Ru multilayer. The seed layer 210 may have a total thickness in the region directly above the WP 206 in the range of about 2-20 nm. The capping layer 230 may be a nonmagnetic layer or multilayer of metals or metal alloys like Ru, Ir, Ta, as shown in the MAMR system of FIG. 3.

Alternatively the capping layer 230 may be a ferromagnetic material, or the capping layer may be omitted and the ferromagnetic TS 170 may be in contact with spacer layer 108 and function as the polarizing layer. In that case, the electron flow is from the WP 140 to the TS 170 where the electrons are reflected and become spin-polarized. However, even if the frequency f of the auxiliary magnetic field from the free layer 106 is not near the resonance of the magnetic material in the grains of the RL, so that there is no microwave assistance, the magnetization mf will still provide a DC field component in the gap between the TS and the WP that will assist the write field $H_0$.

In an embodiment of the disclosure the insulating refill material is a first layer 240 and a second layer 242 wherein the second layer 242 has a higher thermal conductivity that the first layer. The bilayer refill material thus facilitates the transfer of heat away from the WP 206 and STO 220, as depicted by arrows 270, which represent heat transfer. The first layer 240 may be formed of MgO, a silicon nitride ($SiN_x$) or alumina, with a thickness in the range of about 3 to 10 nm. The second layer may be formed of AlN, SiC or a metal like Ru or Cr. The preferred multilayer refill material is $SiN_x$/AlN or $SiN_x$/Ru.

Figure 5A:
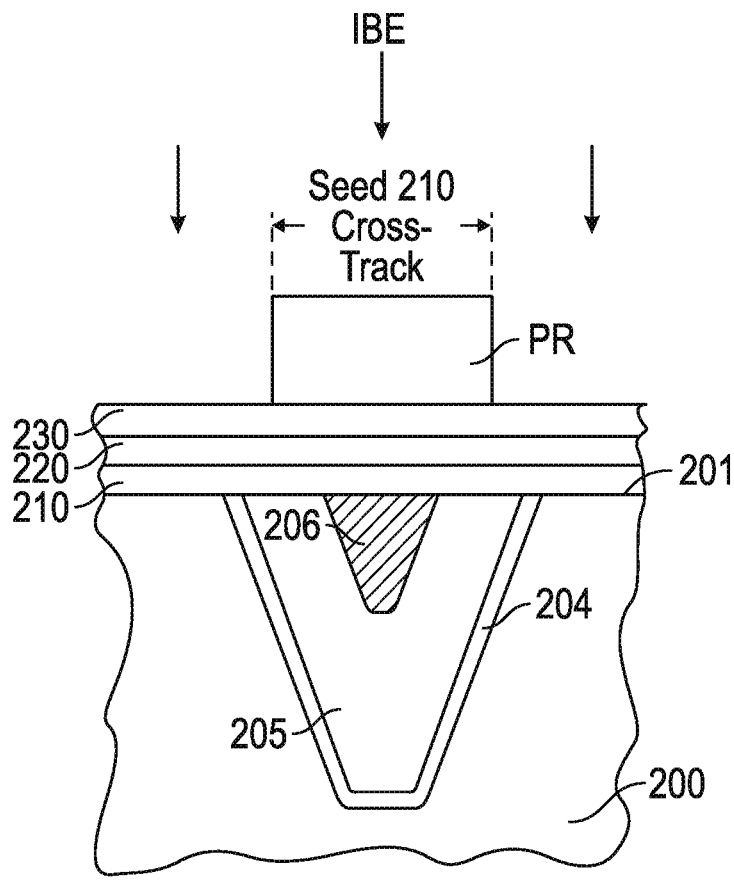
FIGS. 5A-5F are sectional views illustrating the process for making the write head with extended seed layer below the STO, according to an embodiment of the disclosure.

FIGS. 5A-5F are sectional views illustrating one process for making the write head with extended seed layer below the STO according to an embodiment of the disclosure. FIG. 6 illustrates a method 600 of making the write head of FIGS. 5A-5F. FIG. 6 will be described in combination with FIGS. 5A-5F.

In operation 602 of method 600, a seed layer 210 (which may be more than one layer of a multilayered seed layer) is deposited on a planar surface 201 of a substrate 200, one or more STO layers are deposited on the seed layer 210 to form an STO 220, and a capping layer 230 is deposited on the STO 220. The substrate 200 comprises a write pole 206. The write pole 206 is recessed within the substrate 200 such that a surface of the write pole 206 aligns with the planar surface 201 of the substrate 200. The seed layer 210 is deposited over the write pole 206 such that the seed layer 210 covers the write pole 206. As shown in FIG. 5A, the seed layer 210, the layers making up STO 220, and capping layer 230 are sequentially deposited as full films on the substrate surface 201. In operation 604, a photoresist (PR) is lithographically patterned on the capping layer 230 to have a width that will define the width of seed layer 210 in the cross-track direction. The PR may also define the depth of seed layer 210 in a direction orthogonal to the GBS, as shown in FIG. 4B. The PR is disposed above the write pole 206. In operation 606, the structure is then etched by vertical Argon-based ion beam etching (IBE).

Figure 5B:
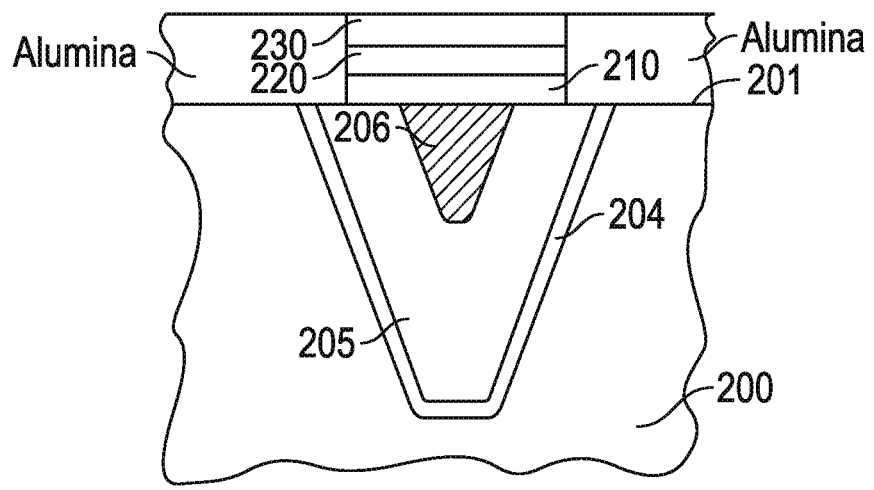
Figure 6:
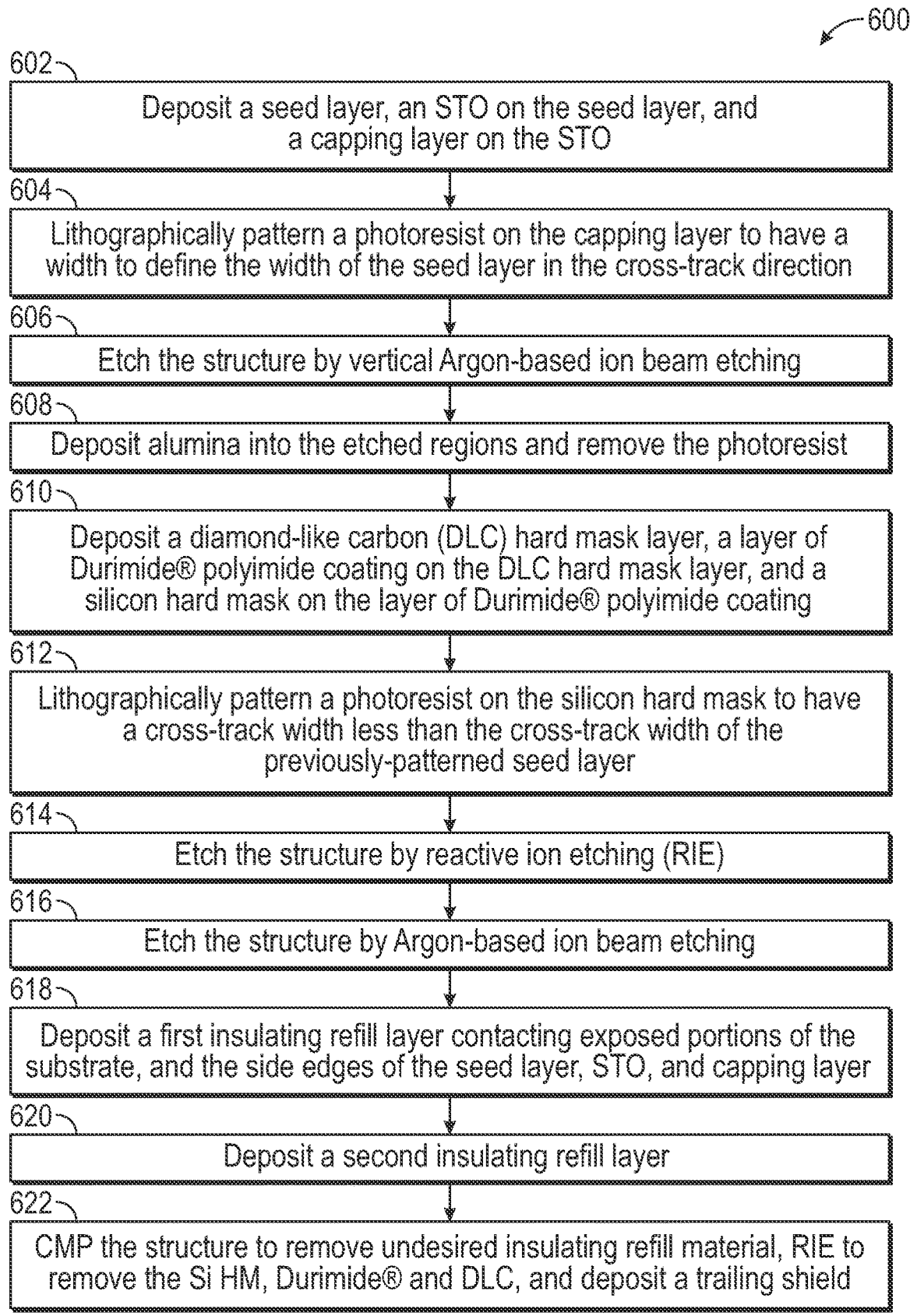
FIG. 6 illustrates a method of forming a write head, according to an embodiment of the disclosure.

In operation 608, after the vertical IBE, alumina is filled into the etched regions and the PR is removed, as shown in FIG. 5B. Then the upper surfaces of the capping layer 230 and the adjacent alumina fill regions are smoothed by chemical-mechanical polishing (CMP).

Figure 5C:
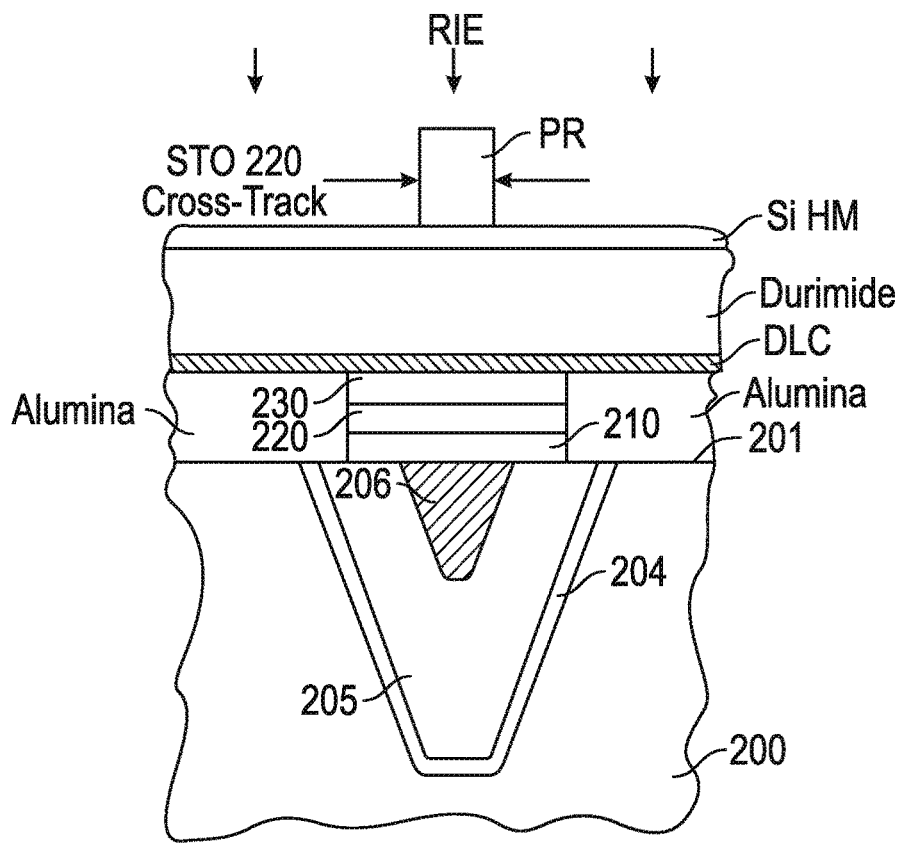

In operation 610, a diamond-like carbon (DLC) hard mask layer is deposited over the alumina and capping layer 230, a layer of Durimide® polyimide coating is deposited on the DLC hardmask layer, and a silicon hard mask is deposited on the layer of Durimide® polyimide coating. FIG. 5C illustrates the DLC hard mask layer, a layer of Durimide® polyimide coating, and a silicon hard mask (Si HM) sequentially deposited. In operation 612, a PR is lithographically patterned on the Si HM to have a cross-track width substantially the same as the cross-track width of STO 220, but less than the cross-track width of previously-patterned seed layer 210, and preferably less than the cross-track width of WP 206. In operation 614, the structure of FIG. 5C is etched by reactive ion etching (RIE), which results in the structure of FIG. 5D.

Figure 5D:
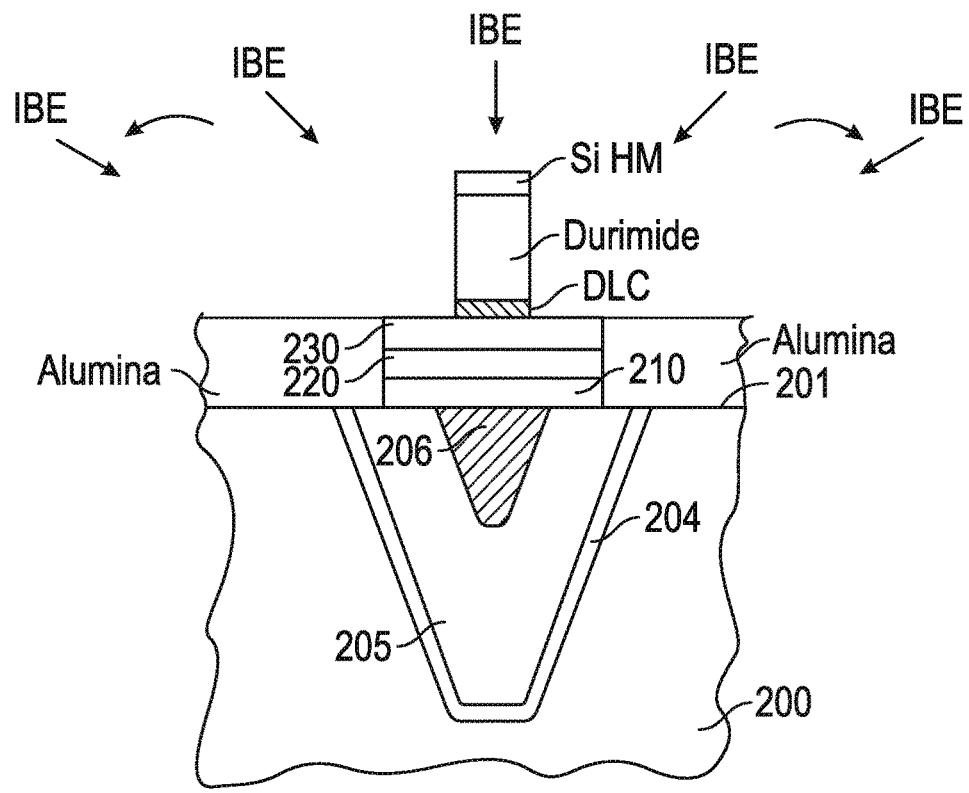
Figure 5E:
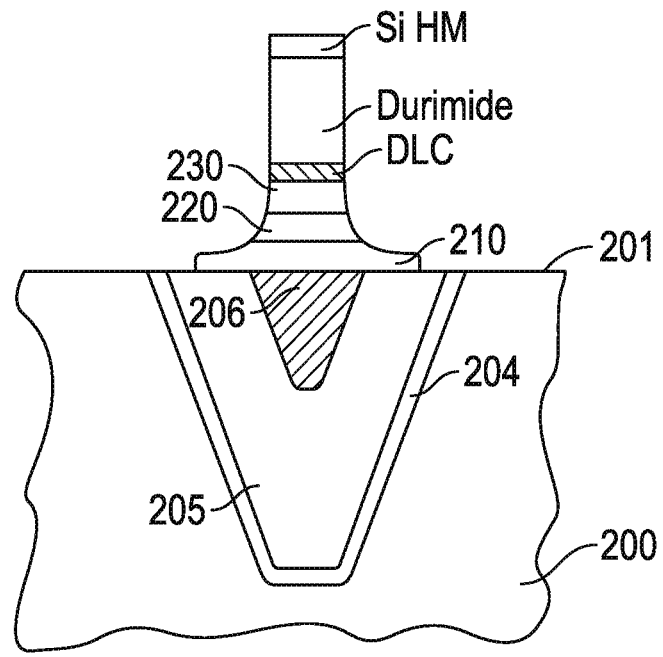

In operation 616, Argon-based IBE is performed on the structure of FIG. 5D, initially vertically and then gradually at angles to vertical, resulting in the structure of FIG. 5E. The Argon-based IBE removes the alumina deposited in operation 608. In FIG. 5E, the STO 220 and capping layer 230 have been etched substantially to the same cross-track width as the cross-track width of the Si HM. By controlling the etching time in operation 616, and because the IBE is at a more horizontal angle in the last stage of the IBE, the seed layer 210 is only partially etched, leaving the seed layer 210 with a cross-track width greater than the cross-track width of the STO 220. As a result of the partial etching, the seed layer 210 is thus thinner at its outer side edges than at its region directly above write pole 206, as shown in FIG. 5E. The seed layer 210 remains in contact with the write pole 206 and a portion of the metal or metal alloy 205. The PR is then removed.

Figure 5F:
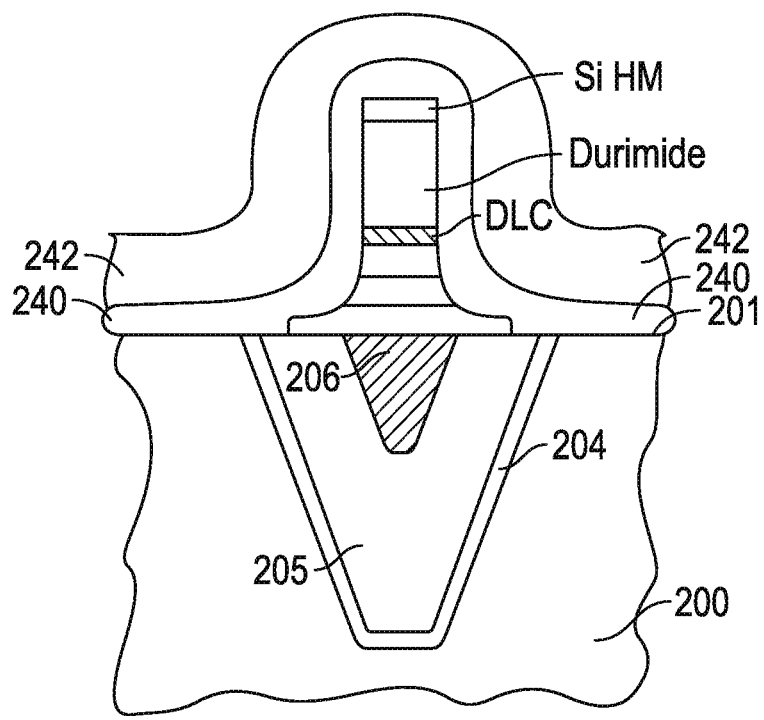

In operation 618, a first insulating refill layer 240 is deposited such that the first insulating refill layer 240 contacts exposed portions of the substrate 201, and the side edges of the seed layer 210, STO 220, and capping layer 230, as shown in FIG. 5F. The first insulating refill layer 240, for example $SiN_x$, is deposited to a thickness in the range of about 3 to 10 nm over the structure of FIG. 5E, resulting in first insulating refill layer 240 being in contact with the exposed portions of substrate 201 and with the side edges of seed layer 210, STO 220, and capping layer 230. In operation 620, a second insulating refill layer 242 is deposited over the first insulating refill layer 240. The second insulating refill layer 242, for example AlN or Ru, is deposited to a thickness up to at least the top of capping layer 230. In operation 622, the structure of FIG. 5F is then subjected to CMP to remove undesired insulating refill material, RIE to remove the Si HM, Durimide® and DLC, and additional CMP, followed by deposition of the trailing shield. This results in the MAMR head with extended seed layer below the STO as depicted in FIGS. 4A-4B.

In one embodiment, a write head comprises a substrate, a write pole recessed into the substrate, and an insulating material surrounding at least two sides of the write pole. The insulating material is recessed into the substrate. A surface of the write pole, a surface of the substrate, and a surface of the insulating material align to form a substantially planar surface. The write head further comprises a seed layer disposed on the write pole and a portion of the insulating material on the substantially planar surface, the seed layer having a first cross-track width parallel to the substantially planar surface of the substrate, a spin torque oscillator disposed on the seed layer, the spin torque oscillator having a second cross-track width less than the first cross-track width of the seed layer, and one or more insulating refill layers disposed on the substantially planar surface adjacent to the seed layer, the spin torque oscillator, and the capping layer.

The write head may further comprise a capping layer disposed on the spin torque oscillator, the capping layer having a third cross-track width less than the first cross-track width of the seed layer. The one or more insulating refill layers may contact a portion of the insulating material on the substantially planar surface. The one or more insulating refill layers may comprise a first insulating refill layer and a second insulating refill layer. The first insulating refill layer may contact the seed layer, the spin torque oscillator, and the capping layer. The second insulating refill layer may contact the first insulating refill layer and is spaced from the seed layer, the spin torque oscillator, and the capping layer. The second insulating refill layer may have a higher thermal conductivity than the first insulating refill layer. The seed layer may have a first thickness directly above the write pole and a second thickness directly above the insulating material, the first thickness being greater than the second thickness. The second cross-track width of the spin torque oscillator may be less than a fourth cross-track width of the write pole.

In another embodiment, a microwave-assisted magnetic recording assembly comprises at least one load beam assembly, a flexure coupled to the at least one load beam assembly, a slider coupled to the flexure, the slider having a trailing surface, and a write head coupled to the trailing surface of the slider. The write head comprises a write pole having a first cross-track width, an insulating material surrounding at least two sides of the write pole, and a substrate surrounding at least two sides of the insulating material. The write pole and the insulating material are recessed into the substrate. A surface of the write pole, a surface of the substrate, and a surface of the insulating material align to form a substantially planar surface. The write head further comprises a seed layer disposed on the write pole and a portion of the insulating material on the substantially planar surface, the seed layer having a second cross-track width less than the first cross-track width, a spin torque oscillator disposed on the seed layer, the spin torque oscillator having a third cross-track width less than both the first cross-track width of the write pole and the second cross-track width of the seed layer, and one or more insulating refill layers disposed on the substantially planar surface adjacent to the seed layer, the spin torque oscillator, and the capping layer.

The MAMR head may further comprise a capping layer disposed on the spin torque oscillator, the capping layer having the third cross-track width of the spin torque oscillator. The MAMR head may further comprise a diamond-like carbon hard mask layer disposed on the capping layer, a polyimide coating disposed on the diamond-like carbon hard mask layer, and a silicon hard mask disposed on the polyimide layer. The one or more insulating refill layers may comprise a first insulating refill layer and a second insulating refill layer. The first insulating refill layer may contact the seed layer, the spin torque oscillator, a capping layer, the diamond-like carbon hard mask layer, the polyimide coating, and the silicon hardmask. The second insulating refill layer may contact the first insulating refill layer and is spaced from each of the seed layer, the spin torque oscillator, the capping layer, the diamond-like carbon hard mask layer, the polyimide coating, and the silicon hardmask. The spin torque oscillator may comprise a ferromagnetic free layer, a nonmagnetic spacer layer on the free layer, and a ferromagnetic polarizing layer on the spacer layer.

In another embodiment, a method of forming a write head comprises depositing a seed layer on a substrate, the substrate comprising a write pole. The seed layer is deposited to cover the write pole. The method further comprises depositing one or more spin torque oscillator (STO) layers on the seed layer to form an STO, depositing a capping layer on the STO, lithographically patterning a first photoresist on the capping layer having a width that defines a width of seed layer in the cross-track direction, etching portions of the seed layer, the STO, and the capping layer using vertical Argon-based ion beam etching, depositing alumina into the etched portions, removing the first photoresist, depositing a diamond-like carbon hard mask layer over the alumina and capping layer, depositing a polyimide coating on the diamond-like carbon hard mask layer, depositing a silicon hard mask on the polyimide coating, lithographically patterning a second photoresist on the silicon hard mask, etching the diamond-like carbon hard mask layer, the polyimide coating, the silicon hard mask, and the alumina one or more times, removing the second photoresist layer, and depositing one or more insulating refill layers.

Etching the diamond-like carbon hard mask layer, the polyimide coating, the silicon hard mask, and the alumina one or more times may comprise a first reactive ion etch and a second Argon-based ion beam etch. Depositing one or more insulating refill layers may comprise depositing a first insulating refill layer contacting exposed portions of the substrate, and the side edges of the seed layer, the one or more STO layers, and the capping layer. Depositing one or more insulating refill layers may comprise depositing a second insulating refill layer on the first insulating refill layer. Etching the diamond-like carbon hard mask layer, the polyimide coating, the silicon hard mask, and the alumina one or more times may remove the alumina from the write head.

While the present disclosure has been particularly shown and described with reference to the preferred embodiments, it will be understood by those skilled in the art that various changes in form and detail may be made without departing from the spirit and scope of the disclosure. Accordingly, the information disclosed herein is to be considered merely as illustrative and limited in scope only as specified in the appended claims.

While the foregoing is directed to embodiments of the present disclosure, other and further embodiments of the disclosure may be devised without departing from the basic scope thereof, and the scope thereof is determined by the claims that follow.

What is claimed is:

1. A write head, comprising:
    a substrate;
    a write pole recessed into the substrate;
    an insulating material surrounding at least two sides of the write pole, the insulating material recessed into the substrate, wherein a surface of the write pole, a surface of the substrate, and a surface of the insulating material align to form a substantially planar surface;
    a seed layer disposed on the write pole and a portion of the insulating material on the substantially planar surface, the seed layer having a first cross-track width parallel to the substantially planar surface of the substrate, wherein the seed layer comprises outer portions disposed directly above the insulating material having a first substantially constant thickness, and an inner portion disposed directly above the write pole having a second substantially constant thickness greater than the first substantially constant thickness;
    a spin torque oscillator disposed on the seed layer, the spin torque oscillator having a second cross-track width less than the first cross-track width of the seed layer;
    one or more insulating refill layers disposed on the substantially planar surface adjacent to the seed layer and the spin torque oscillator.

2. The write head of claim 1, further comprising a capping layer disposed on the spin torque oscillator, the capping layer having a third cross-track width less than the first cross-track width of the seed layer.

3. The write head of claim 1, wherein the one or more insulating refill layers contact a portion of the insulating material on the substantially planar surface.

4. The write head of claim 1, wherein the one or more insulating refill layers comprise a first insulating refill layer and a second insulating refill layer.

5. The write head of claim 4, wherein the first insulating refill layer contacts the seed layer, the spin torque oscillator, and a capping layer.

6. The write head of claim 5, wherein the second insulating refill layer contacts the first insulating refill layer and is spaced from the seed layer, the spin torque oscillator, and the capping layer.

7. The write head of claim 4, wherein the second insulating refill layer has a higher thermal conductivity than the first insulating refill layer.

8. The write head of claim 1, wherein the second cross-track width of the spin torque oscillator is less than a fourth cross-track width of the write pole.

9. A magnetic recording device comprising the write head of claim 1.

10. A microwave-assisted magnetic recording (MAMR) assembly comprising:
    at least one load beam assembly;
    a flexure coupled to the at least one load beam assembly;
    a slider coupled to the flexure, the slider having a trailing surface;
    a write head coupled to the trailing surface of the slider, the write head comprising:
        a write pole having a first cross-track width;
        an insulating material surrounding at least two sides of the write pole;
        a substrate surrounding at least two sides of the insulating material, wherein the write pole and the insulating material are recessed into the substrate, and wherein a surface of the write pole, a surface of the substrate, and a surface of the insulating material align to form a substantially planar surface;
        a seed layer disposed on the write pole and a portion of the insulating material on the substantially planar surface, the seed layer having a second cross-track width greater than the first cross-track width;
        a spin torque oscillator disposed on the seed layer, the spin torque oscillator having a third cross-track width less than both the first cross-track width of the write pole and the second cross-track width of the seed layer;
        a capping layer disposed on the spin torque oscillator;
        a diamond-like carbon hard mask layer disposed on the capping layer;
        a polyimide coating disposed on the diamond-like carbon hard mask layer;
        a silicon hard mask disposed on the polyimide coating; and
        one or more insulating refill layers disposed on the substantially planar surface adjacent to the seed layer and the spin torque oscillator, wherein the one or more insulating refill layers comprise a first insulating refill layer and a second insulating refill layer, wherein the first insulating refill layer contacts the seed layer, the spin torque oscillator, the capping layer, the diamond-like carbon hard mask layer, the polyimide coating, and the silicon hard mask.

11. The MAMR assembly of claim 10, wherein the capping layer has the third cross-track width of the spin torque oscillator.

12. The MAMR assembly of claim 10, wherein the second insulating refill layer contacts the first insulating refill layer and is spaced from each of the seed layer, the spin torque oscillator, the capping layer, the diamond-like carbon hard mask layer, the polyimide coating, and the silicon hard mask.

13. The MAMR assembly of claim 12, wherein the second insulating refill layer has a higher thermal conductivity than the first insulating refill layer, and wherein the second insulating refill layer has a greater thickness than the first insulating refill layer.

14. The MAMR assembly of claim 10, wherein the spin torque oscillator comprises a ferromagnetic free layer, a nonmagnetic spacer layer on the free layer, and a ferromagnetic polarizing layer on the spacer layer.

15. A magnetic recording device comprising the MAMR assembly of claim 10.

16. A write head, comprising:
    a substrate;
    a write pole recessed into the substrate;
    an insulating material surrounding at least two sides of the write pole, the insulating material recessed into the substrate, wherein a surface of the write pole, a surface of the substrate, and a surface of the insulating material align to form a substantially planar surface;
a seed layer disposed at a gas bearing surface (GBS) on the write pole and a portion of the insulating material on the substantially planar surface, the seed layer having a first cross-track width parallel to the substantially planar surface of the substrate and a first depth in a direction orthogonal to the GBS;
a spin torque oscillator disposed at the GBS on the seed layer, the spin torque oscillator having a second cross-track width less than the first cross-track width of the seed layer and a second depth in the direction orthogonal to the GBS less than the first depth; and
a first insulating refill layer disposed on the substantially planar surface adjacent to the seed layer and the spin torque oscillator; and
a second insulating refill layer disposed on the first insulating refill layer, the second insulating refill layer being disposed over at least a portion of the seed layer in an along-a-track direction.

17. The write head of claim 16, wherein the seed layer has a first thickness directly above the write pole and a second thickness directly above the insulating material, the first thickness being greater than the second thickness.

18. The write head of claim 16, wherein the write pole is spaced from the first and second insulating refill layers, and wherein the spin torque oscillator comprises a ferromagnetic free layer, a nonmagnetic spacer layer on the free layer, and a ferromagnetic polarizing layer on the spacer layer.

19. The write head of claim 16, wherein the second insulating refill layer has a higher thermal conductivity than the first insulating refill layer.

20. A magnetic recording device comprising the write head of claim 16.

* * * * *